United States Patent [19]
Nishizawa

[11] 4,365,262
[45] Dec. 21, 1982

[54] SEMICONDUCTOR IMAGE SENSOR

[75] Inventor: Junichi Nishizawa, Sendai, Japan

[73] Assignee: Handotai Kenkyu Shinkokai, Sendai, Japan

[21] Appl. No.: 210,712

[22] Filed: Nov. 26, 1980

[51] Int. Cl.³ .................. H01L 27/14; H01L 31/00
[52] U.S. Cl. ................................. 357/31; 357/22; 357/30
[58] Field of Search ............... 357/30, 30 G, 22, 22 E, 357/31, 24; 307/238.8, 574

[56] References Cited
U.S. PATENT DOCUMENTS

| | | | |
|---|---|---|---|
| 4,148,051 | 4/1979 | Koike | 357/31 X |
| 4,270,059 | 5/1981 | Nishizawa et al. | 357/22 X |
| 4,317,127 | 2/1982 | Nishizawa | 357/22 X |
| 4,320,410 | 3/1982 | Nishizawa et al. | 357/30 X |
| 4,326,209 | 4/1982 | Nishizawa et al. | 357/22 X |

OTHER PUBLICATIONS

Nishizawa et al., *IEEE Journ. Solid State Circuits*, vol. SC-13, No. 6, Oct. 1978.

*Primary Examiner*—Martin H. Edlow
*Attorney, Agent, or Firm*—Sughrue, Mion, Zinn, Macpeak & Seas

[57] ABSTRACT

A semiconductor image sensor employing static induction transistors having a nonsaturating current-voltage characteristic providing a high degree of linearity over a wide range of optical input intensities and a high operating speed. A plurality of high resistance channel regions are formed on a substrate region. Low resistance semiconductor storage regions of the same conductivity type are formed on corresponding ones of the channel regions and gates which form controllable potential barriers are provided around the channel regions. An insulating film is formed over the low resistance storage regions. Electrically conductive bit line electrodes are formed over the insulating film and electrical conductive word lines are connected to corresponding ones of the gates.

11 Claims, 12 Drawing Figures

SEMICONDUCTOR IMAGE SENSOR

BACKGROUND OF THE INVENTION

The present invention relates to a semiconductor image sensor, and more particularly, to a semiconductor image sensor employing a static induction transistor structure, capable of providing a wide linear dynamic range and a high operating speed.

Static induction transistors (hereinafter referred to as "SIT" when applicable) capable of exhibiting nonsaturating current-voltage characteristics have been employed for integrated circuits. Such transistors have been proved experimentally to be suitable for large scale integrated circuits because of their low power consumption. On the other hand, SITs have very wide dynamic ranges and hence are excellent for use in analog circuits. Applications of SITs to solid state image sensors were also proposed, for example, in U.S. patent application Ser. No. 878,441, filed on Feb. 16, 1978, Ser. No. 39,445, filed on May 15, 1979 and Ser. No. 130,775, filed on Mar. 17, 1980. These image sensors have much wider linearity range and higher operating speed than charge coupled image (CCI) sensors.

An SIT is analogous in structure to a field-effect transistor although its channel length is short and the density of impurities in the channel region is low. Specifically, the density of impurities in the channel region is low to such extent that the depletion layer extending from the gate region into the channel region pinches off the channel region without causing breakdown, with or without the aid of the gate voltage. Also, the channel length is made sufficiently short that the length of the potential barrier provided by the pinch-off effect is very short and the height of the barrier is controllable by the drain voltage and that the equivalent resistance from the source electrode to the potential barrier, acting as a negative feedback resistance, is low. As a result, a nonsaturating drain current-voltage characteristic is obtained due to the operational principle of barrier height control by drain (and gate) voltage. An SIT dynamic random access memory (hereinafter referred to as "d-RAM" when applicable) is provided by floating one of the source and the drain regions of each SIT and forming a storage capacitor by the floated source or drain region. In other words, a dynamic memory cell is formed by connecting a capacitor in series to the source or drain region of an SIT. A solid-state image sensor may be constructed by arranging SIT d-RAM array to store optical inputs. A depletion mode SIT image sensor of the back-illumination type was proposed in the above-mentioned U.S. application Ser. No. 130,775.

SUMMARY OF THE INVENTION

An object of the invention is to provide a front illumination type solid-state image sensor using SIT's, which has an excellent linearity over a wide optical input range and a high operating speed and can be relatively easily manufactured.

In accordance with an aspect of the invention, there is provided a semiconductor image sensor including a low resistance semiconductor substrate region of a first electrical conductivity type, a plurality of high resistance channel regions formed on the substrate region, low resistance semiconductor storage regions of the first conductivity type formed in corresponding ones of the channel regions, gate means for forming controllable potential barriers in corresponding ones of the channel regions, an insulating film formed on the low resistance semiconductor storage regions, electrically conductive bit line electrodes formed on the insulating film, and electrically conductive word lines connected to corresponding ones of the gate means. The bit line electrodes, insulating film and semiconductor storage regions are arranged to form storage capacitors and to provide optical input windows.

In accordance with another aspect of the invention, there is provided a semiconductor image sensor including a low resistance semiconductor substrate region of a first electrical conductivity type, a plurality of low resistance semiconductor storage regions of the opposite or a second electrical conductivity type forming a plurality of p-n junctions with the substrate region, a plurality of high resistance channel regions formed on corresponding ones of the storage regions, low resistance bit regions formed on corresponding ones of the channel regions, electrically conductive bit lines connected to corresponding ones of the bit regions, gate means for forming controllable potential barriers in corresponding ones of the channel regions, and electrical conductive word means connected to the gate means. The substrate regions and the storage regions form storage capacitors and the bit regions and bit lines have optical input windows therein.

A word line circuit may be connected to the word lines for applying control signals to the gate means for providing electrical switching through the channel between the low resistance bit regions and the storage regions. A bit line circuit may be connected to the bit lines for supplying reverse bias voltages to deplete the storage regions for charging the storage regions and to supply carriers for discharging the storage regions thereby to detect discharge current or voltage.

Other objects, features and advantages of the invention will be apparent from the following description made in conjunction with the accompanying drawings.

DESCRIPTION OF THE PREFERRED EMBODIMENTS

Figure 1:
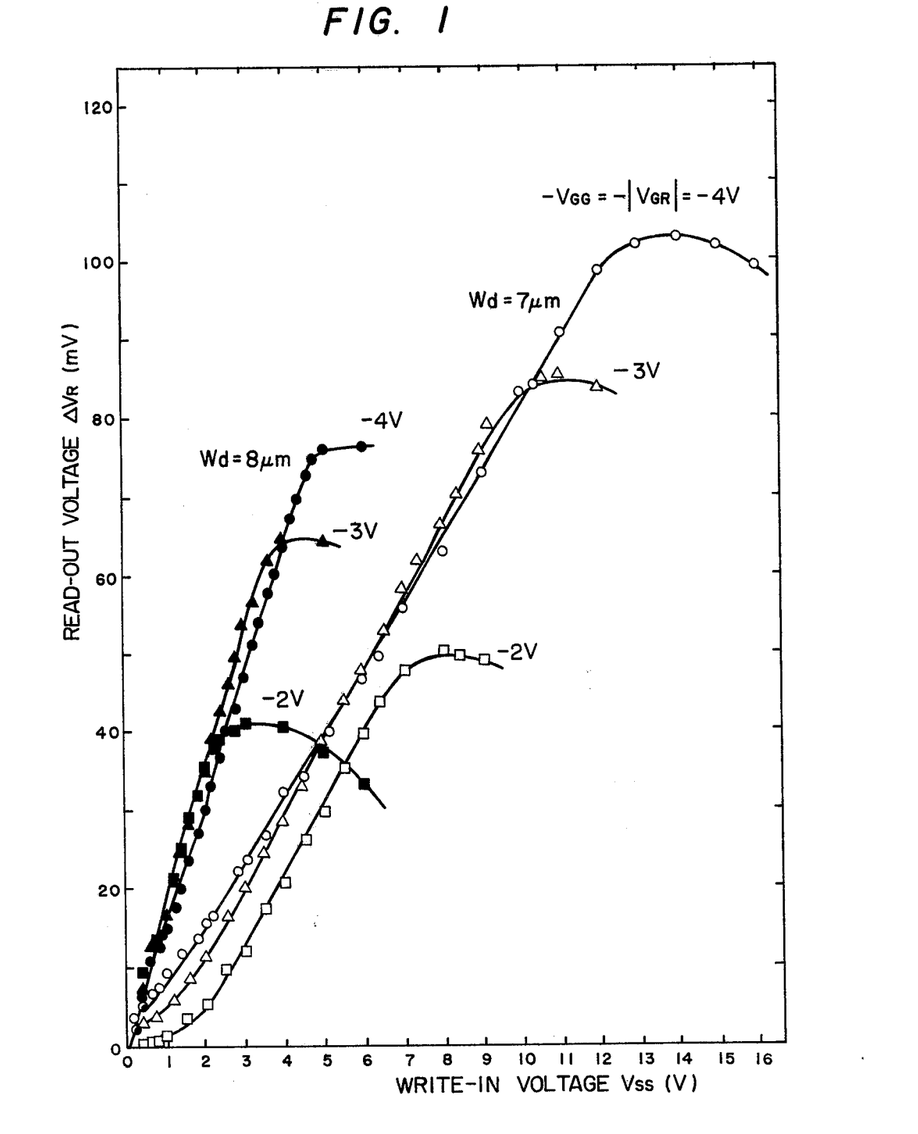
FIG. 1 is a graphical representation indicating characteristics of a dynamic RAM cell using a static induction transistor.
Figure 2A:
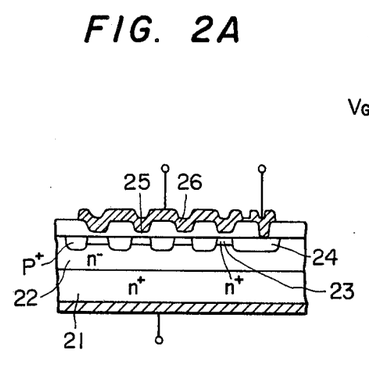
FIGS. 2A and 2B are a schematic partial sectional view of the RAM cell and a circuit diagram used for measuring the characteristics shown in FIG. 1.

FIG. 1 shows the results of experiments indicating the excellent linearity of an SIT d-RAM cell. In FIG. 1, the abscissa represents the write-in voltage $V_{SS}$ and the ordinate the read-out voltage $\Delta V_R$. FIG. 2A schematically shows a model memory cell used for measurements. The model memory cell includes ten sub-cells connected in parallel (four among ten being shown in the figure) for the convenience of measurements. On an n+ substrate 21, an n− epitaxial layer 22 doped with phosphorous to a concentration of about $1 \times 10^{14}$ cm$^{-3}$ was grown to a thickness of about 5 µm. In this epitaxial n− layer 22, boron was selectively diffuses to a surface concentration of about $1 \times 10^{19}$ cm$^{-3}$ and to a depth of about 3 µm so as to form a p+ gate region 24 which defines ten vertical channel regions penetrating therethrough. A thin oxide film of about 1,000 Å thick was selectively formed above the channel regions and phosphorous was implanted through this thin oxide film at an implantation voltage of about 150 KV to a dose of $1 \times 10^{14}$ cm$^{-2}$ so as to form an n+ storage region 23. Then, aluminum electrodes were formed. Namely, an MOS capacitor was formed with the aluminum electrode 26, the oxide film 25 and the n+ storage region 23, and ohmic electrodes were connected to the p+ gate region 24 and the n+ substrate 21. When electrons flow from the storage region 23 to the substrate 21, the storage region acts as a source and the substrate 21 acts as a drain. When electrons flow from the substrate 21 to the storage region 23, the substrate 21 acts as a source and the storage region acts as a drain. The potential of the storage region 23 is controlled capacitively by the voltage applied to the aluminum electrode. When electrons are depleted or accumulated in the storage region 23, the potential across the MOS capacitor is varied.

The gate-to-gate spacing, i.e., channel width, was selected at several values and the experimental results of two samples are shown in FIG. 1. Symbol $W_d$ indicates the gate-to-gate spacing in the diffusion mask, and thereby is larger than the real gate-to-gate spacing by the amount of lateral diffusion of the gate region 24.

Figure 2B:
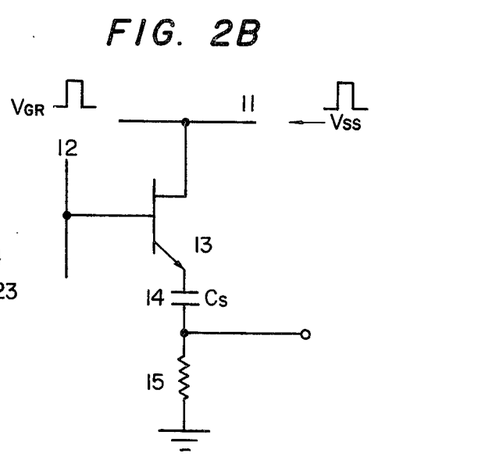

FIG. 2B shows a measuring circuit employed for the experiments. When the MOS capacitor shown in FIG. 2A is charged or discharged, the same amounts of current should flow into or out of the insulated metal electrodes and the storage region. Therefore, a signal output may be derived either from the top insulated metal electrode or from the bottom substrate metal electrode. FIG. 2B shows the case when the output signal is derived from the top insulated metal electrode.

FIG. 1 indicates the results of measurements on two different samples of SIT d-RAM cells. In one of the two samples, the gate-to-gate spacing $W_d$ in the diffusion mask was 7 µm while for the other sample this spacing $W_d$ was 8 µm. For the read-out voltage, the voltage across a resistor 15 (25 Ω) connected to the SIT d-RAM cell was measured with an oscilloscope. The read-out voltage naturally appeared at a lower level than the write-in voltage. In FIG. 1, $V_{GG}$ designates a voltage applied to the gate in the memory retention mode which, in this case, was selected at reverse bias of $V_{GG}=-2$ V, $-3$ V and $-4$ V. In the write-in and read-out modes, the reverse gate bias voltage was removed. Datum was stored in the depletion mode. That is, carriers were extracted from the floating storage region so that data were represented by the level of carrier depletion.

In FIG. 2B, the write-in voltage $V_{SS}$ was applied to a bit line (BL) 11 while a word line pulse $V_{GR}$ was applied to a word line 11 to render an SIT 13 conductive to carry out writing. Here, the magnitude of the word line pulse $V_{GR}$ was selected equal to that of the reverse gate bias $V_{GG}$. In the memory retention mode, both the word line pulse and the write-in voltage were removed. Namely, the bit line 11 was grounded and the reverse voltage $-V_{GG}$ was applied to the word line to reverse-bias the n-channel SIT. Here, since the storage region is positively biased, electrons may flow from the substrate to the storage region without such reverse gate bias. Reading was carried out by applying the word line pulse $V_{GR}$ to the word line to render the SIT conductive. In the sample having the gate spacing of 7 µm, the linear relationship between the read-out voltage $\Delta V_R$ and the write-in voltage $V_{SS}$ was maintained up to a write-in voltage $V_{SS}$ of 12 V for $-V_{GG}=-4$ V. The linearity range increases upon increasing the reverse gate bias $V_{GG}$ because, as the reverse gate bias $V_{GG}$ increases, the height of a potential barrier formed in the channel is increased which thus increases the amount of voltage which can be stored. For the same reason, the linearity range decreases with an increasing gate spacing $W_d$. That is, if the channel width is large, with the same reverse gate bias, the height of the potential barrier formed in the channel is low and therefore a high voltage cannot be stored. These features reflect the intrinsic nature of SIT that the height of the potential barrier formed in the channel (at the intrinsic gate portion) is under influence of the drain voltage.

The results indicated in FIG. 1 are for the depletion mode in which carriers are extracted from the floating region. Of course, storage may be carried out by accumulating majority carriers in the floating region. This is referred to as accumulation mode. However, the linear relationship in the accumulation mode is not so excellent. That is, the linear relationship in the depletion mode is much better than that in the accumulation mode. In addition to this, the memory retention time for the depletion mode is longer than for the accumulation mode and variations of the memory content with temperature changes for the depletion mode are much smaller than for the accumulation mode. Thus, the depletion mode is superior to the accumulation mode in many respects. This will become more apparent from the following description.

In the depletion mode, as carriers are extracted from the floating region, that is, as the amount of majority carrier shortage is increased, an increasing reverse bias is established between the floating region and the gate region. On the other hand, in the accumulation mode, as the number of excessive majority carriers is increased in the floating region, the reverse bias between the floating region and the gate region is decreased. When the stored voltage of the floating region becomes higher than the reverse gate bias, the gate junction is forward-biased as a result of which minority carriers flow into the respective ones of the gate and the floating region. Accordingly a part of stored charges forming the memory information is lost.

Figure 3:
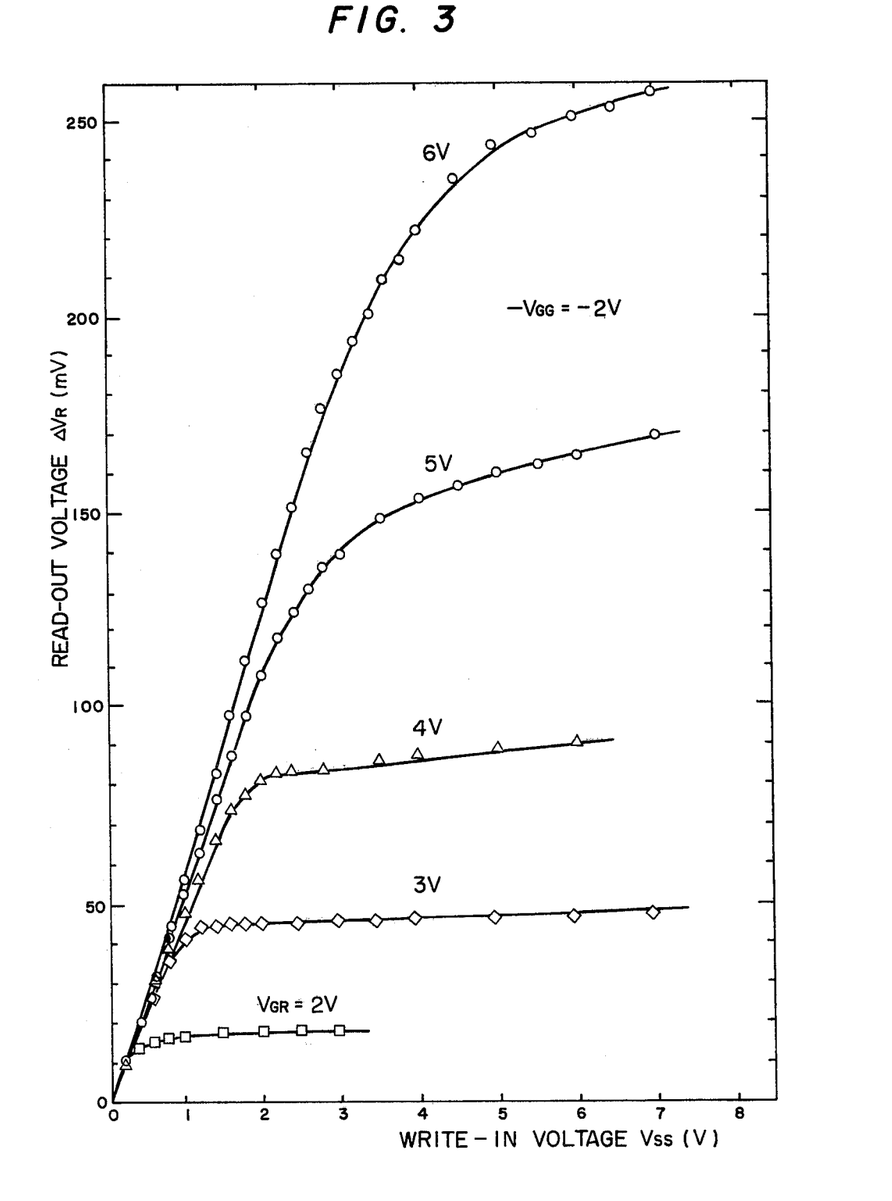
FIG. 3 is a graphical representation indicating the characteristics of a dynamic RAM cell using an insulated gate field-effect transistor.

Depletion mode storage can be utilized in the MOS FET d-RAM cell as well as the SIT d-RAM cell. FIG. 3 shows the results of experiments indicating the linear relationship between the read-out voltage $\Delta V_R$ and the write-in voltage $V_{SS}$. The circuit used for these experiments was the same as shown in FIG. 2. An MOS FET had a saturating current-voltage characteristic. The write-in voltage at which the read-out voltage $\Delta V_R$ begins to saturate is substantially equal to the saturating drain voltage at which current saturation occurs on the saturating current-voltage characteristic curve. In addition, the plots of $\Delta V_R$ vs $V_{SS}$ is substantially similar in form to the drain current-voltage characteristic curve on the MOS FET.

The range of linearity of an SIT having an unsaturating characteristic is much larger than that of an MOS FET. That is, a memory having a wide dynamic range can be realized using SITs.

Figure 4:
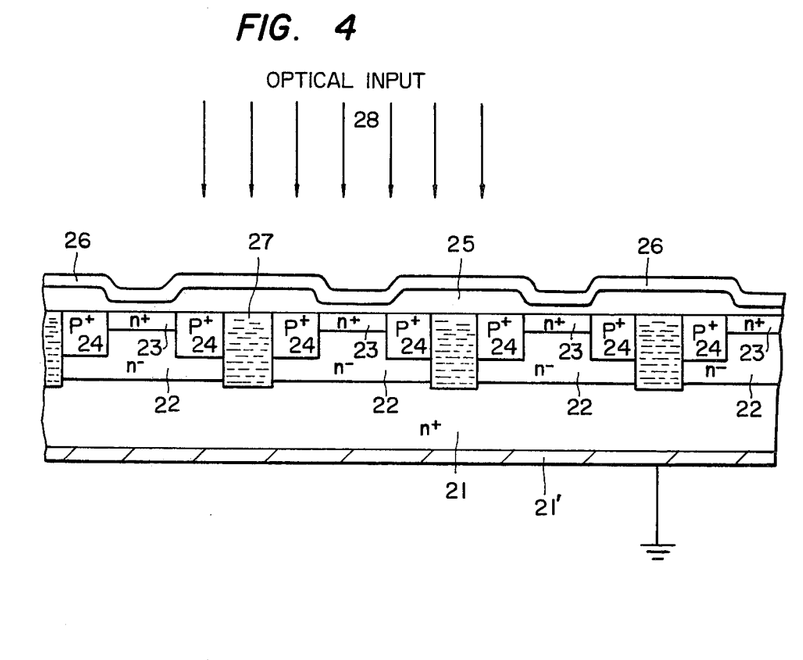
FIGS. 4 and 5 are, respectively, a partial sectional view and a circuit diagram of a preferred embodiment of a semiconductor image sensor according to the invention.

FIG. 4 is a sectional view showing the structure of a preferred embodiment of a top-illumination type semiconductor image sensor. The sectional view of FIG. 4 shows the structure sectioned along a bit line. The image sensor includes an n+ silicon substrate 21, n− epitaxial layers 22, n+ surface floating layers 23, p+ gate regions 24, an insulating film 25 formed of one or more of $SiO_2$, $Si_3N_4$ and $Al_2O_3$, bit lines 26, isolating regions 27 of $SiO_2$ or the like, and a substrate electrode 21'. The bit line 26 may be totally formed of a transparent electrode of $In_2O_3$ or $SnO_2$ or of low resistance polysilicon. Alternatively, only the parts of the bit line 26 located above the n+ surface floating regions 23 may be made of the above-described materials for forming optical windows while the remaining parts may be made of metal such as Al and Mo. The insulation film 25 formed on the n+ regions 23 is very thin, for instance, about 20 to 1,000 Å for increasing the storage capacitance $C_S$ as much as possible. The capacitance can be increased further by providing a double-polysilicon structure by connecting a low resistance polysilicon layer to the n+ regions 23.

In FIG. 4 the word lines connected to the gate regions 24 are not shown, but extend vertically to the sheet of drawing. Reference numeral 28 designates an optical input.

Figure 5:
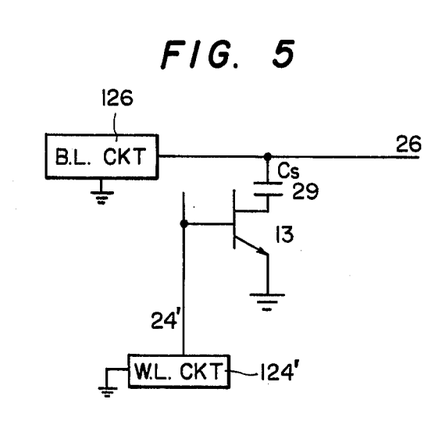

FIG. 5 is a circuit diagram showing the arrangement of one cell. In FIG. 5, reference numeral 26 designates a bit line, 24' a word line, 29 a storage capacitor $C_S$, 126 a bit line circuit, and 124' a word line circuit. It is to be noted that the word line circuit 124' provides at least two voltage levels which turns the SIT 13 on and off irrespective of the state of the storage capacitor $C_S$, i.e., whether the capacitor $C_S$ is charged or discharged. Also, the bit line circuit 126 provides at least two voltage levels, one of which can repel free charge carriers from the storage region to establish a depleted (charged) state. The bit line circuit should also include a sense amplifier for reading out the stored information.

Figure 6:
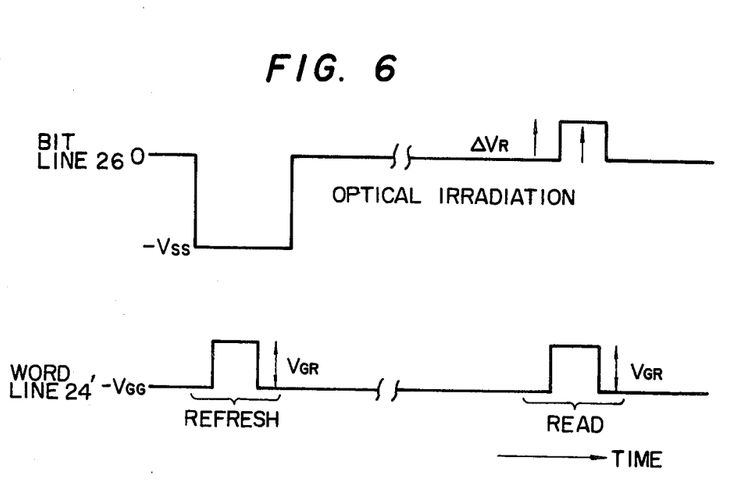
FIG. 6 is a voltage waveform diagram for driving the semiconductor image sensor shown in FIGS. 4 and 5.

The operation of the image sensor shown in FIG. 4 will be described. FIG. 6 shows the waveform of a voltage on the word line, i.e., output of the word line circuit, and the waveform of a voltage on the bit line, i.e., output and input of the bit line circuit.

First, the refreshing operation will be described. While the SIT is rendered conductive by applying a pulse voltage $V_{GR}$ to the word line, a negative voltage $-V_{SS}$ is applied to the bit line. Assuming that the storage capacitor $C_S$ was discharged to have no voltage thereacross, the voltage $-V_{SS}$ is applied across the SIT 13 and electrons flow out of the n+ floating region 23 into the substrate 21. As the n+ floating region 23 becomes depleted of electrons, it becomes positively charged. The potential across the storage capacitor $C_S$ increases to finally approximately equal to $V_{SS}$. In this case, the amount of positive charge $Q_{SS}$ stored in the n+ floating region 23 is $C_S V_{SS}$. If the SIT becomes turned off before the capacitor $C_S$ obtains a voltage of about $V_{SS}$, the analysis should be modified by replacing $V_{SS}$ with a certain stored voltage. Upon application of an optical input under these conditions, electron-hole pairs are formed in the n− region 22 the number of which is determined proportional to the intensity of the injected light. Most of the electrons created by the optical input are absorbed into the n+ region 23 by acceleration due to the electric field established by the stored positive charge in the n+ region 23. If the total charge of electrons thus absorbed is represented by $\Delta n$, then the amount of charge in the floating region 23 becomes $C_S V_{SS} - q\Delta n$ where q is the magnitude of the electronic charge. Thus, the potential of the region 23 is $V_{SS} - q\Delta n / C_S$. The value $\Delta n$ is linearly proportional to the intensity of the optical input and hence the voltage across the storage capacitor $C_S$ decreases linearly proportional to the optical input.

Reading is carried out by applying the pulse $V_{GR}$ to the word line. The read-out voltage $\Delta V_R$ on the bit line is approximately represented by:

$$\frac{C_S}{C_B + C_S}\left(V_{SS} - \frac{q\Delta n}{C_S}\right)$$

where $C_B$ is the bit line capacitance. That is, the read-out voltage $\Delta V_R$ is decreased in proportion to the optical input intensity. A decoder is connected to the word line and a sense amplifier is connected to the bit line. The read out voltage is amplified by the sense amplifier and from there is coupled to utilization circuits.

In the structure shown in FIG. 4, the n+ substrate is used as one current electrode. When the number of bit line is one, i.e., in case of a linear image sensor, the respective cells can be addressed only by the read voltage $V_{GR}$.

When a multiplicity of memory cells are disposed in a matrix configuration, a plurality of memory cells are commonly connected to one word line. According to the above-described read-out operation, the plurality of memory cells connected to the same word line are read out simultaneously.

When random access read-out is desired, it is necessary to prevent read-out of all the cells except one to be addressed. Such prevention of read-out may be achieved by applying an intermediate voltage, for example, $-V_{SS}/2$, for raising the potential of the storage region to other word lines with or without decreasing the height of the read-out pulse applied to the word line. Dynamic range of the operation, however, should inevitably be narrowed by such modification.

Figure 7A:
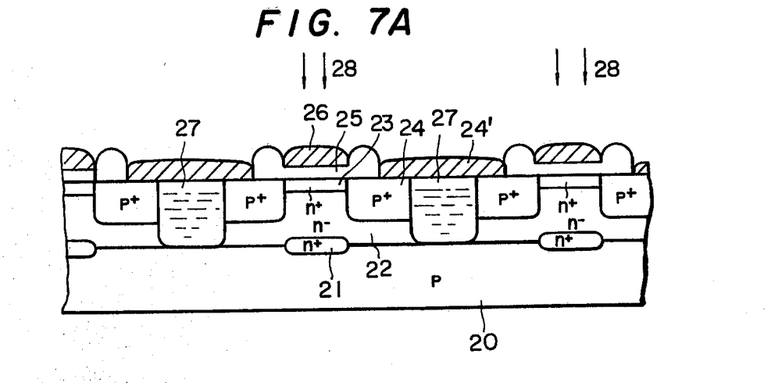
FIGS. 7A and 7B are a schematic partial cross-section and a partial circuit diagram of another embodiment of a semiconductor image sensor according to the invention.
Figure 7B:
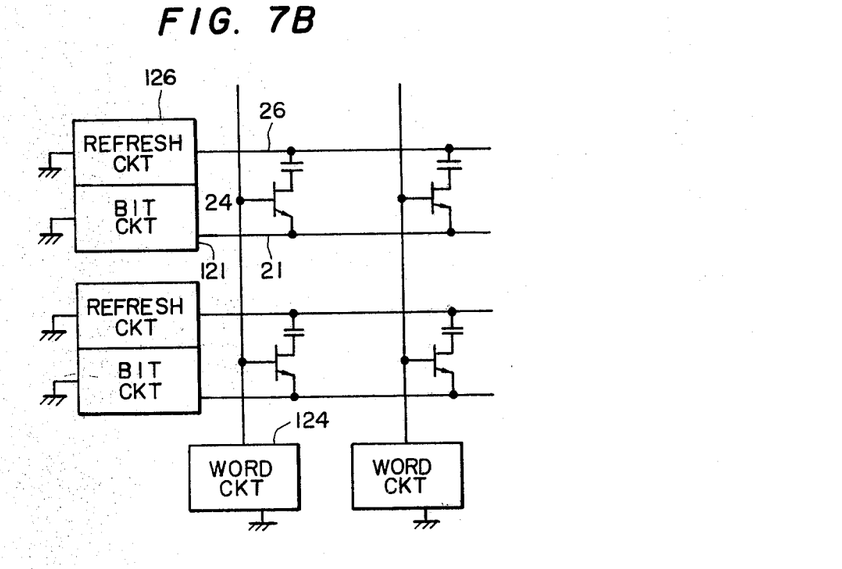

FIGS. 7A and 7B show another example of image sensor in which random access read-out can be easily achieved without lowering the dynamic range.

FIG. 7A shows a schematic cross-section along the word line 24. On a p substrate 20, buried n+ bit regions 21 are formed, and an n− epitaxial layer 22 is formed. The structure of FIG. 7A is similar to that of FIG. 4 in other respects. Namely, the common current electrode formed of a substrate in FIG. 4 is substituted by separate embedded electrode regions in FIG. 7A. These embedded n+ regions 21 will be called bit lines and the electrode 26 forming one electrode of the storage capacitor will be called insulated electrode.

FIG. 7B shows a circuit diagram of an image sensor. Each row has one refresh line 26 and one bit line 21 and each column has one word line. A refresh circuit 126 provides a refreshing pulse, a word line circuit 124' provides controlling signals which turns on and off the SIT and a bit line circuit provides bit line controlling voltage and senses a read-out voltage.

In this case, each SIT is turned on when the corresponding word line circuit provides a forward gate bias pulse and simultaneously the corresponding bit line is set at ground potential. The other bit lines are supplied with a positive bias so as to reversely bias the gate junction and to prevent the flow of electrons from the embedded bit line 21 to the storage region 23. Thus, random access read-out can be achieved.

As is apparent from the above description, in the image sensors shown in FIGS. 4 and 7A, the storage capacitance is provided in the surface of the structure. However, a structure having storage regions in the interior of a semiconductor chip can also be used for the image sensor.

Figure 8:
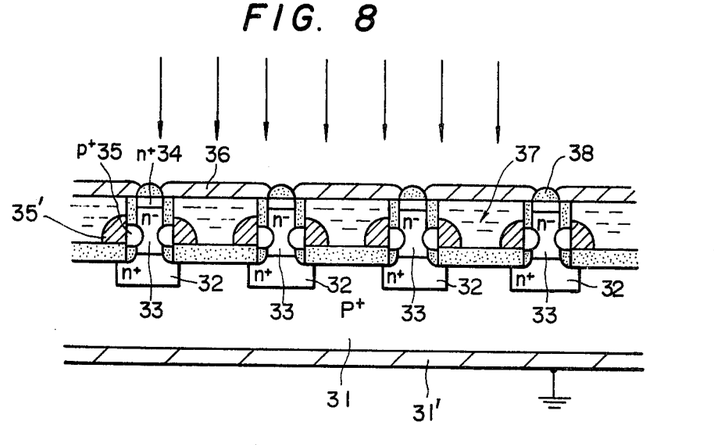
FIGS. 8 and 9 are, respectively, a partial sectional view and a circuit diagram of another embodiment of a semiconductor image sensor according to the invention.

Another embodiment of an image sensor constructed in accordance with the invention is shown in FIG. 8 which is a sectional view of a structure taken along a bit line similar to FIG. 4. The structure of this image sensor, as shown in FIG. 7, includes a p+ substrate 31, n+ buried floating regions 32, n− channel regions 33, n+ surface regions 34, p+ gate regions 35, bit lines 36, isolating regions 37, transparent electrodes 38, and a p+ substrate electrode 31'. The storage capacitance $C_S$ is provided by the pn junction between the n+ region 32 and the p+ substrate 31.

In this embodiment, the gate region 35 is provided beside the undercut region although the invention is not limited to this arrangement. For instance, the p+ gate regions 35 may be formed by diffusion or ion implantation from the surface without using an undercut. The p+ substrate 31 is grounded.

Figure 9:
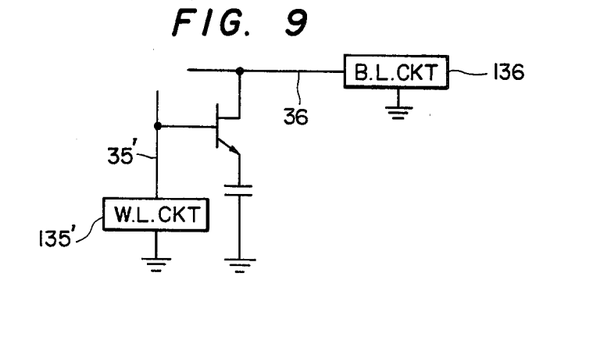
Figure 10:
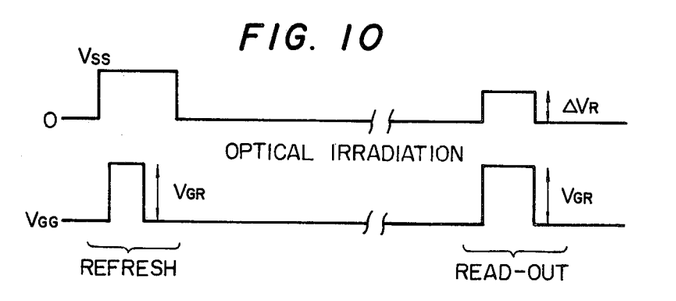
FIG. 10 is a voltage waveform diagram for driving the semiconductor image sensor shown in FIGS. 7 and 8.

A circuit diagram is shown in FIG. 9. The operation of the circuit is generally similar to that of the circuit shown in FIG. 5. However, the circuit of FIG. 9 differs from that of FIG. 5 in that a positive voltage $V_{SS}$ is applied to the bit line 36 in the refreshing process for extracting electrons from the buried n+ region 32 as shown in FIG. 10. Data are stored in the form of electron depletion in the n+ region 32 with the amount of electron depletion decreasing linearly with an increasing optical illumination intensity.

In the electron depletion mode, the memory retention time exceeds several tens of seconds. Furthermore, the memory retention characteristic is insensitive to temperature variation. For instance, when the temperature is increased from 20° C. to 75° C., the variation of memory retention time is only of the order of 5%. As described above, the depletion mode provides excellent linearity.

With the SIT image sensor thus constructed, unlike the charge coupled image sensor in which the memory must be read out sequentially, the memory of the invention can be read out in a random access manner. Therefore, its operating speed is extremely high. Accordingly, due to its wide linear range, the SIT image sensor operates excellently as a semiconductor image sensor.

It is clear that the structure of the semiconductor image sensor of the invention is not limited to those shown in FIGS. 4, 7A and 8. Many modifications, alterations and partial substitutions or combinations are possible. The conductivity types can evidently be reversed.

In the embodiment of FIG. 4, it is preferable that the n+ regions 23 be separated from the p+ gate regions 24. The p+ gate regions 24 are preferably separated from the n+ region 21. However, the p+ gate regions 24 may be in direct contact with the n+ region 21, if desired. The channel is described above as being formed solely by the n− region although a thin p region which is substantially depleted may be inserted therein. The gist lies in electrically floating one of the two main electrodes of the SIT which is formed to have a short channel and to provide a non-saturating current-voltage characteristic, and in forming a storage capacitance with the floated electrode. The channel dimensions and the impurity density in the channel are so selected that a sufficiently high potential barrier is formed in the channel with a preselected reverse bias applied to the gate. In the refreshing process, majority carriers are extracted from the floating region to provide a depleted condition of majority carriers, and carriers created by light illuminations are allowed to flow into the floating region thereby to change the amount of majority carrier depletion.

While the invention has been described with reference to a junction gate structure, it will be evident that the technical concept of the invention is applicable to Schottky gate structures and insulated gate structures as well.

What is claimed is:

1. A semiconductor image sensor comprising:
   a low resistance semiconductor electrode region of a first electrical conductivity type;
   a plurality of high resistivity channel regions formed on said electrode region;
   low resistivity semiconductor storage regions of said first electrical conductivity type formed on corresponding ones of said channel regions;
   gate means for forming controllable potential barriers in corresponding ones of said channel regions;
   an insulating film formed on said low resistivity semiconductor storage regions;
   electrically conductive line electrodes formed on said insulating film; and
   electrically conductive control lines connected to corresponding ones of said gate means,
   said line electrodes, insulating film and semiconductor storage regions forming storage capacitors and optical input windows.

2. The semiconductor image sensor as claimed in claim 1 further comprising:
   a control circuit connected to said control lines for applying control signals to said gate means to turn on and off the current path in said channel region between said electrode region and said storage regions; and
   means for supplying reverse bias voltages to the storage regions thereby to deplete said storage regions, and for supplying carriers to the storage region to discharge said storage regions and thereby to detect discharge current or voltage.

3. A semiconductor image sensor comprising:
   a low resistivity semiconductor substrate region of a first electrical conductivity type;
   a plurality of low resistivity semiconductor storage regions of a second electrical conductivity type forming a plurality of p-n junctions with said substrate region;
   a plurality of high resistivity channel regions formed on corresponding ones of said storage regions;

low resistivity bit regions formed on corresponding ones of said chanel regions;
electrically conductive bit lines connected to corresponding ones of said bit regions;
gate means for forming controllable potential barriers in corresponding ones of said channel regions; and
electrically conductive word means connected to said gate means,
said substrate region and storage regions forming storage capacitors and said bit regions and bit lines having optical input windows.

4. The semiconductor image sensor as claimed in claim 3 further comprising:
a word line circuit connected to said word lines for applying control signals to said gate means to turn on and off the current path in said channel region between said bit region and said storage regions; and
a bit line circuit connected to said bit lines for supplying reverse bias voltages to deplete said storage regions and for supplying carriers to the storage region to discharge said storage regions and thereby to detect discharge current or voltage.

5. The semiconductor image sensor as set forth in claim 1 or 2, wherein said insulating film has a thickness in the range of 20 to 1,000 Å.

6. The semiconductor image sensor as set forth in claim 1 or 2, further comprising a low resistance polysilicon layer disposed over said low resistance semiconductor storage regions.

7. The semiconductor image sensor as set forth in claim 1 or 2, wherein said electrode region comprises a buried layer of said first electrical conductivity type provided on a substrate of the opposite electrical conductivity type.

8. The semiconductor image sensor as set forth in any of claims 1 to 4 further comprising a thin region of the electrical conductivity type opposite to that of said channel region formed in corresponding ones of said high resistivity channel regions.

9. A semiconductor image sensor formed in a semiconductor body having at least one main surface, and including a plurality of picture cells disposed in a matrix chape, wherein each picture cell comprises:
a first semiconductor region of a first conductivity type, having a low resistivity and disposed adjacent to said main surface;
a channel semiconductor region of said first conductivity type, having a high resistivity and disposed under said first semiconductor region;
a second semiconductor region of a second conductivity type opposite to said first conductivity type, having a low resistivity and disposed adjacent to said channel semiconductor region to define at least part of the periphery of said channel semiconductor region;
a third semiconductor region of said first conductivity type, having a low resistivity and disposed under said channel semiconductor region;
means for forming an insulated electrode on said first semiconductor region and for forming an optical window for transmitting lights injected thereon into said semiconductor wafer; and
the image sensor further comprising:
selective bias source means connected to each cell for supplying a first and a second bias between said insulated electrode and said third semiconductor region the former of which depletes said first semiconductor region and the latter of which re-neutralize the same, and for supplying a third and fourth bias to said second semiconductor region the former of which isolates said first semiconductor region from said second semiconductor region even when the first semiconductor region is depleted and the latter of which electrically connects said first semiconductor region with said third semiconductor region.

10. A semiconductor image sensor according to claim 9, wherein said semiconductor body has a common portion of said second conductivity type and said third semiconductor region is embedded in the semiconductor body and located on said common portion.

11. A semiconductor image sensor according to claim 10, wherein said each picture cell further comprises isolation region formed of an insulating substance disposed around said second semiconductor region and extending at least partially from said main surface to said common portion.

* * * * *